Figure 1A:
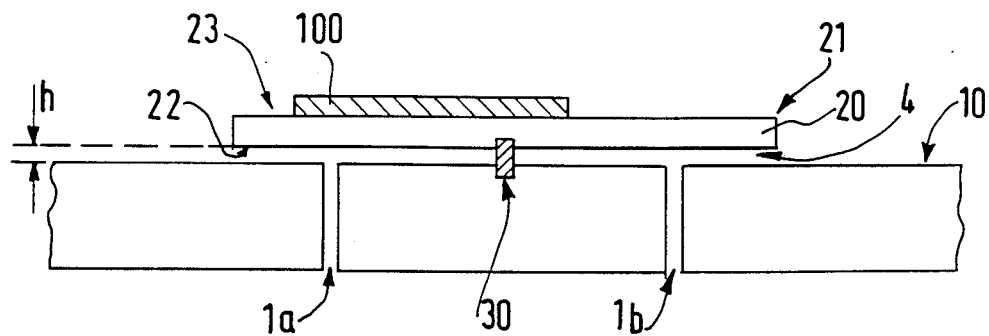

United States Patent [19]

Frijlink

[11] Patent Number: 4,860,687
[45] Date of Patent: Aug. 29, 1989

[54] DEVICE COMPRISING A FLAT SUSCEPTOR ROTATING PARALLEL TO A REFERENCE SURFACE ABOUT A SHIFT PERPENDICULAR TO THIS SURFACE

[75] Inventor: Peter M. Frijlink, Crosne, France

[73] Assignee: U.S. Philips Corporation, New York, N.Y.

[21] Appl. No.: 26,497

[22] Filed: Mar. 16, 1987

[30] Foreign Application Priority Data

Mar. 21, 1986 [FR] France ............................ 86 04078

[51] Int. Cl.[4] .......................................... B05C 11/00
[52] U.S. Cl. .................................. 118/500; 118/730; 406/87; 406/88; 406/92; 108/138
[58] Field of Search ............... 118/730, 725, 500, 52, 118/320; 406/92, 87, 88; 104/23.2; 108/139, 104, 20

[56] References Cited

U.S. PATENT DOCUMENTS

| 3,332,656 | 7/1967 | Johnson, Jr. et al. | 108/139 X |
| 3,721,210 | 3/1973 | Helms et al. | 118/730 X |
| 3,730,134 | 5/1973 | Kadi | 118/52 X |
| 3,783,822 | 1/1974 | Wollam | 118/725 |
| 3,822,652 | 7/1974 | Burdick et al. | 108/139 |
| 4,242,038 | 12/1980 | Santini et al. | 406/87 X |
| 4,275,282 | 6/1981 | Miller | 118/730 X |
| 4,386,255 | 5/1983 | Berkman et al. | 118/730 X |
| 4,403,567 | 9/1983 | daCosta et al. | 118/500 |
| 4,512,391 | 4/1985 | Harra | 118/725 X |
| 4,690,591 | 9/1987 | Nagashima et al. | 406/88 |

OTHER PUBLICATIONS

Von Burg et al., "Orienting Bernoulli Effect Wafer Transfer Mechanism", IBM Tech. Disc. Bulletin, Nov. 1975, pp. 1836-1837.
Sacco et al., "Pedestal Orienter", IBM Techn. Disc. Bulletin, Jan. 1976, pp. 2529-2530.
O'Neill et al., "Annular Orientor", IBM Tech. Disc. Bulletin, Jul. 1977, pp. 593-594.

Primary Examiner—Shrive Beck
Assistant Examiner—Alain Bashore
Attorney, Agent, or Firm—Paul R. Miller

[57] ABSTRACT

A device comprising a flat susceptor rotating parallel to a reference surface about a rotary shaft perpendicular to this surface and comprising means for obtaining the stability of the susceptor held in sustentation and means for obtaining its rotary movement, is characterized in that these means are constituted by the structure of the susceptor, of the rotary shaft and of the reference surface, which cooperate with each other under the action of one or several flow of gas.

18 Claims, 11 Drawing Sheets

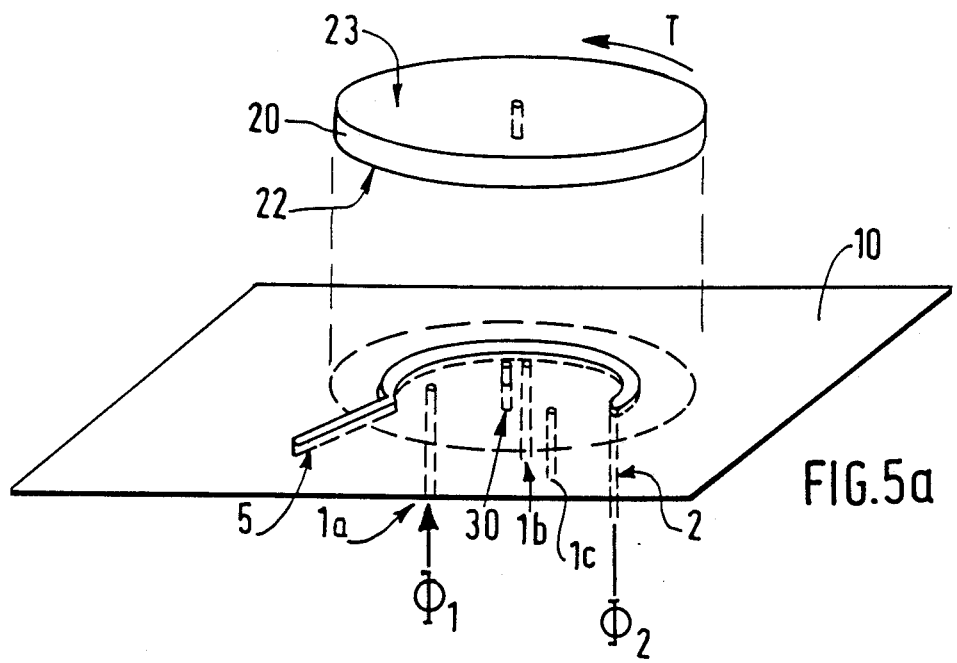
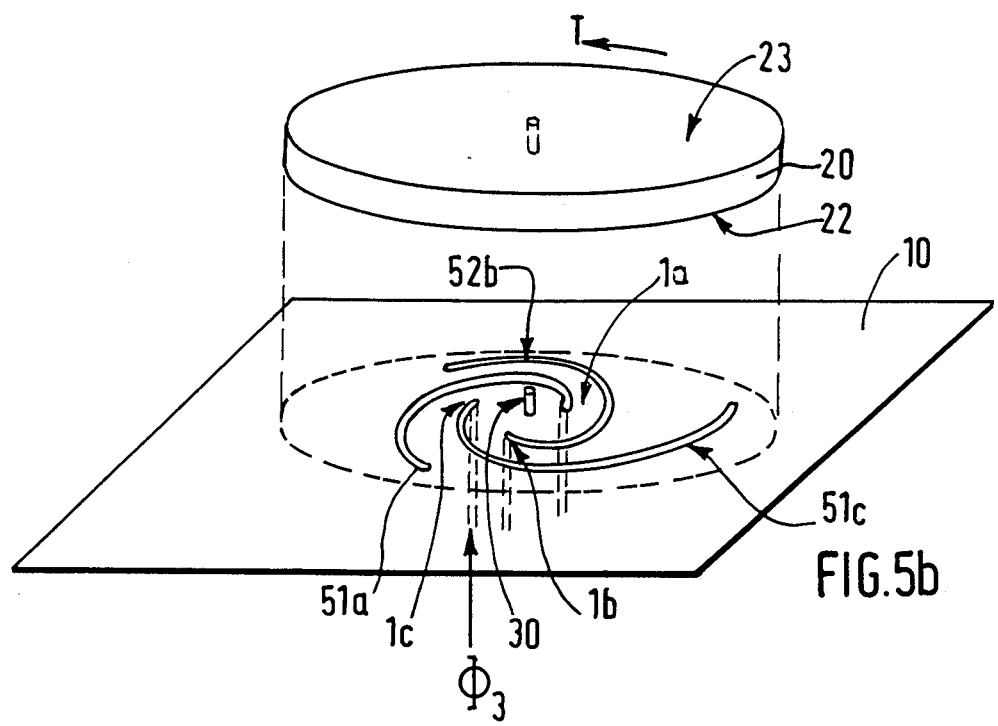

DEVICE COMPRISING A FLAT SUSCEPTOR ROTATING PARALLEL TO A REFERENCE SURFACE ABOUT A SHIFT PERPENDICULAR TO THIS SURFACE

The invention relates to a device comprising a flat susceptor rotating parallel to a reference surface about a shaft perpendicular to this surface and comprising means for obtaining the stability of the susceptor held in sustentation and means for obtaining its rotary movement.

The invention further relates to a reactor chamber for vapour phase expitaxy provided with such a device.

The invention can be used in the manufacture of flat rotating sample carriers for vapour phase epitaxy chambers, more particularly for the epitaxial growth from the vapour phase of layers of compounds of the III-IV group for forming semiconductor devices.

The use of rotating sample carriers in the field of epitaxial growth from the vapour phase of the compounds of the III-IV group is known from the publication entitled "Multi-Wafer Growth of Extremely Uniform GaAs Layers by Organometallic Vapour Phase Epitaxy" during the Electronic Materials Conference, University of Colorado, June 19-21, 1985, by S. Komeno, H. Tanaka, I. Itoh et alii. This publication shows that it is important during the growth of epitaxial layers from the vapour phase to cause the sample to rotate in order to obtain uniform layers permitting of forming components of high quality, such as field effect transistors, diodes etc.

However, the conditions in which these layers are formed, which conditions imply high temperatures of the order of 850° C. and a controlled atmosphere of, for example, hydrogen, result in that the use of conventional methods of transmission by a motor outside the chamber meets with difficulties.

In fact, in this application, the sample carrier must be in good thermal contact with the heating device in order to prevent the temperature variations in the sample, these variations leading to variations of the homogeneity of the epitaxial layers formed at the surface.

Therefore, the invention provides a rotating susceptor that can be used in a vapour phase epitaxy chamber, which permits of solving these problems.

According to the invention, these problems are solved by a susceptor of the kind defined in the opening paragraph, characterized in that these means are constituted by the structures of the susceptor, of the rotary shaft and of the reference surface, which cooperate with each other under the action of one or several flows of gas.

The susceptor according to the invention then has inter alia the following advantages:

the absence of mechanical members traversing the reference wall is on the one hand favourable for the operation at high temperatures and on the other hand favourable for the introduction into the chamber of polluting gases, such as arsine or phosphine, without fear for leakage;

a good thermal contact by conduction in the gas with the reference wall. In fact, the thickness of the gas layer between the susceptor and this wall is generally very small. This is also favourable for the use of this susceptor as a sample carrier of an epitaxy chamber;

the steps of starting the rotary movement and of stopping this movement can readily be controlled in that they simply depend upon the circulation of a flow of gas;

the technique proposed is particularly adapted to the use of planetary movements by a simple superimposition of several rotating platforms on a larger rotating platform. It would be extremely complicated to obtain such a movement by means of conventional mechanical means, for example by means of gear transmissions due to the fact that the choice of the materials is limited by the necessity of purity imposed by the envisaged application on the chamber of a reactor. Thus, in an embodiment which would include the use of gear transmissions, it would be necessary for this application implying moreover high temperatures to use non-lubricated refractory materials. The assembly would then be susceptible to a very rapid wear due to fine dust particles particularly detrimental to the envisaged application. Moreover, by such conventional means, it is difficult to obtain a small distance between platform and reference surface because this always leads to a mechanical contact due to dust. With such conventional means, a poorer thermal conduction will thus be obtained.

Figure 1B:
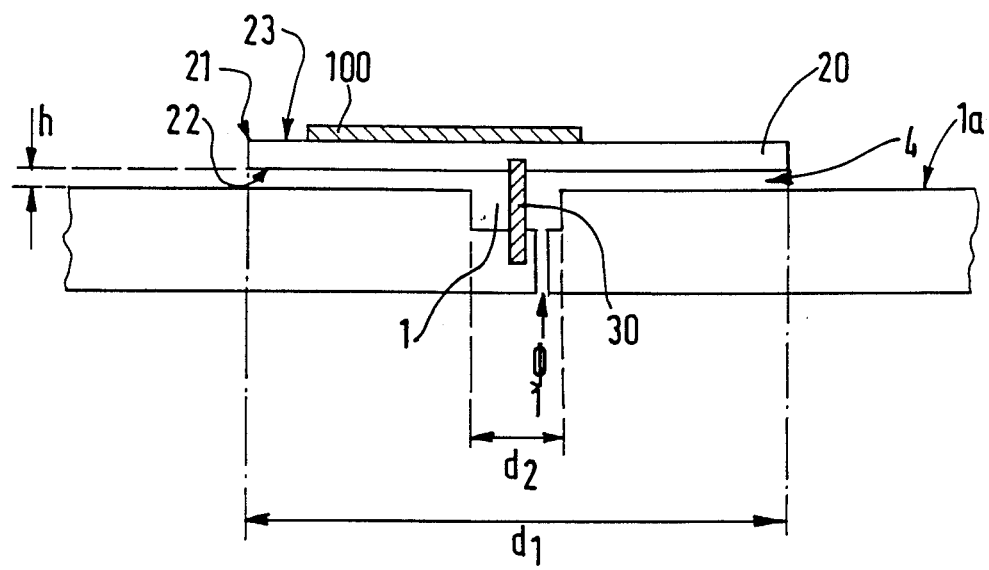
Figure 1C:
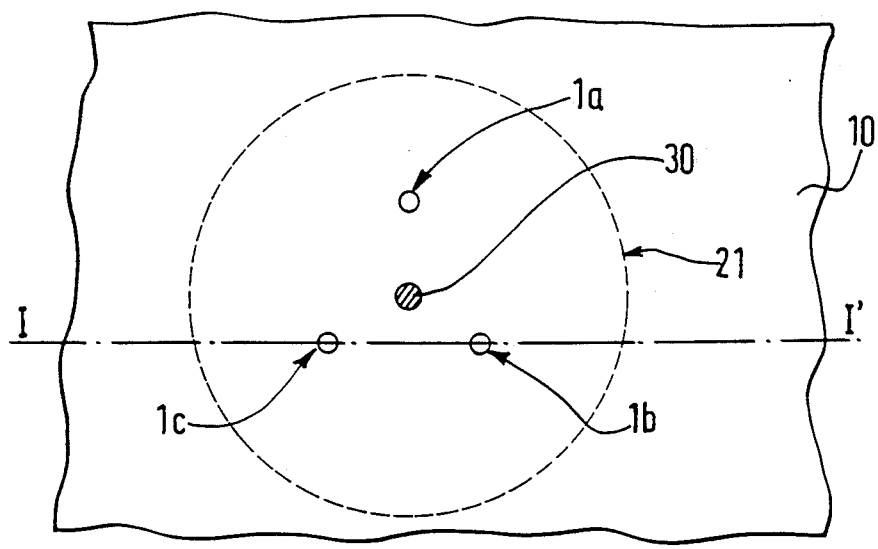
Figure 1D:
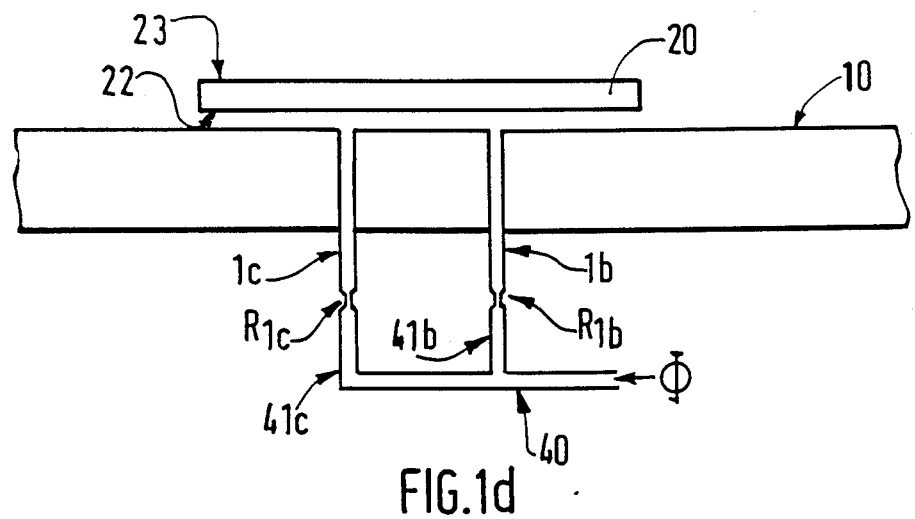
Figure 2:
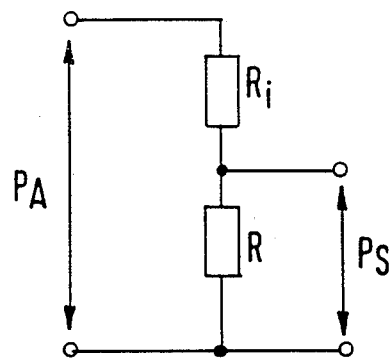
Figure 3:
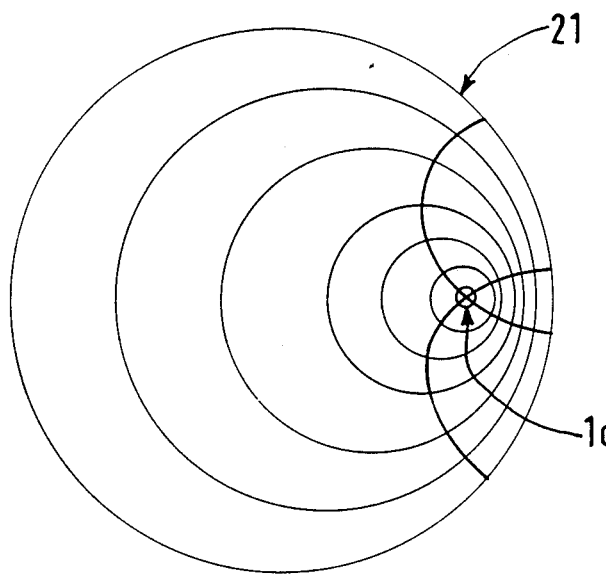
Figure 4A:
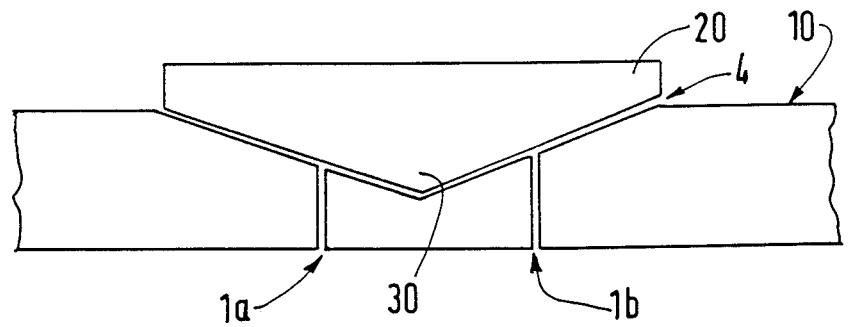
Figure 4B:
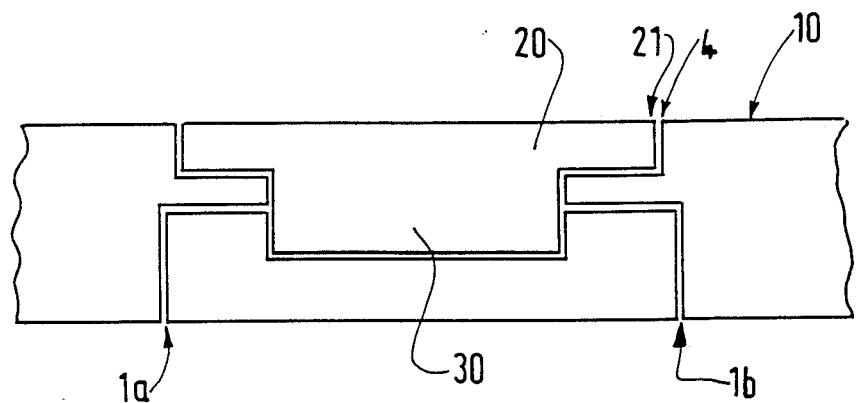
Figure 5C:
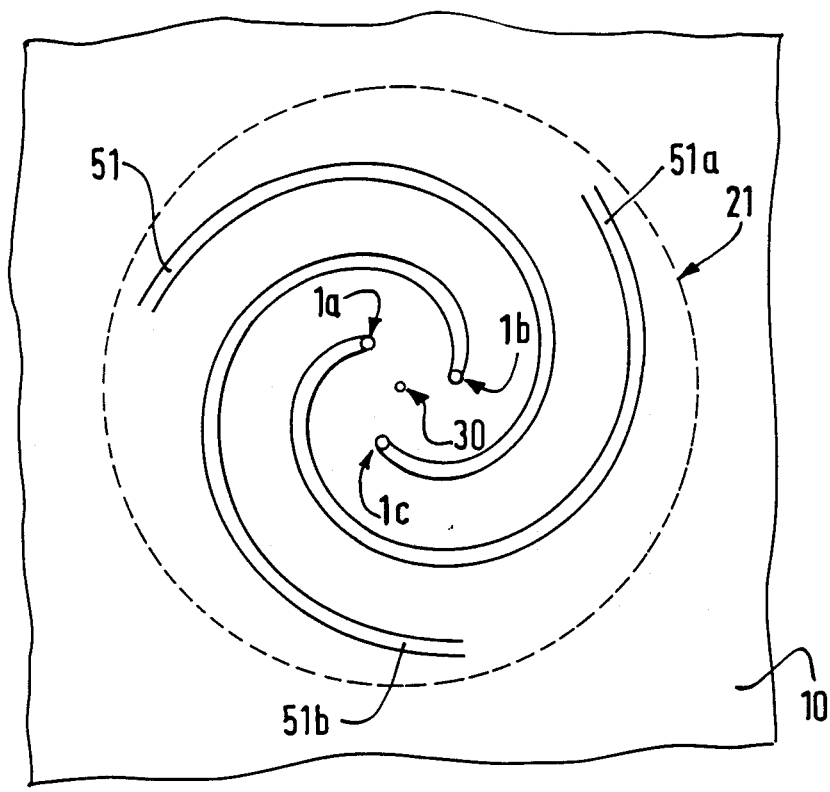
Figure 6A:
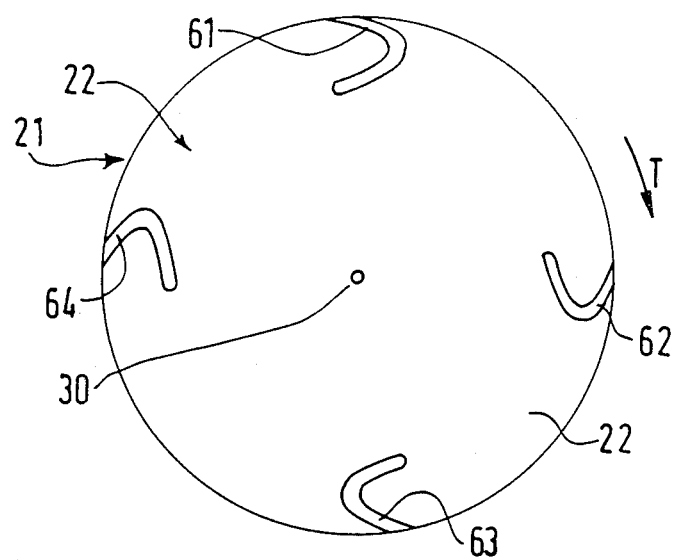
Figure 6A:
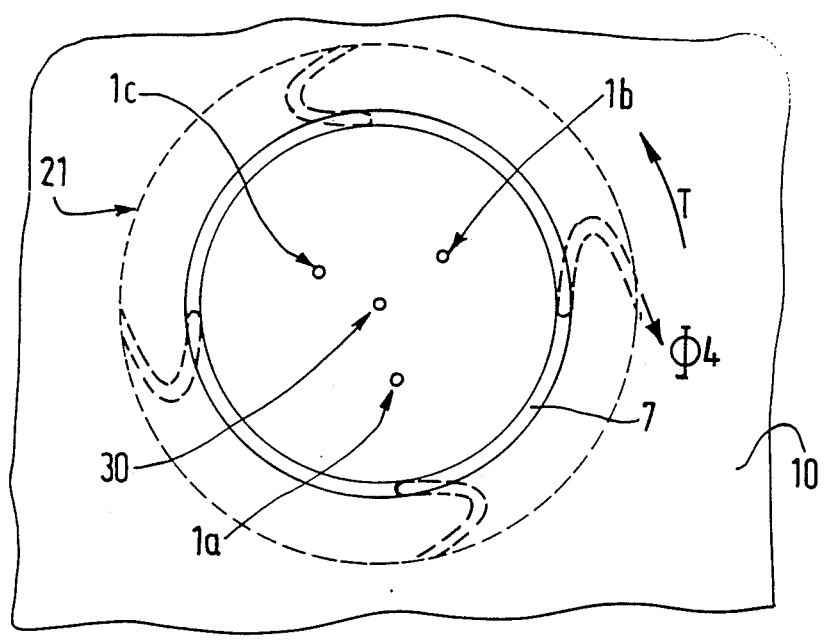
Figure 6B:
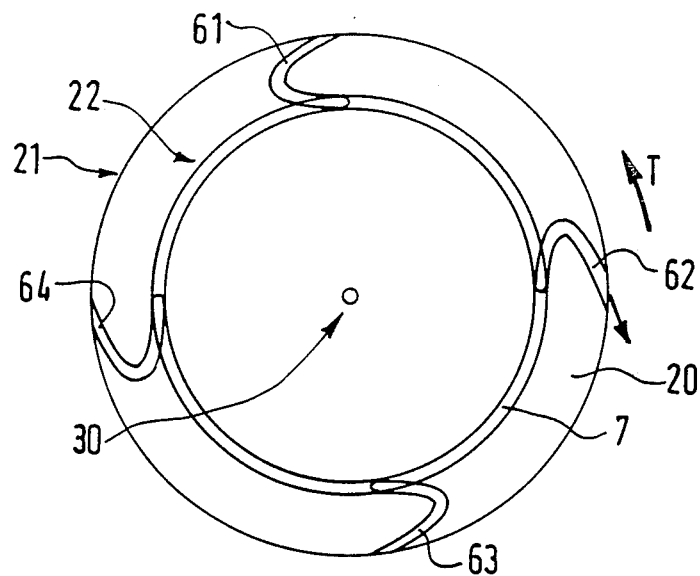
Figure 6B:
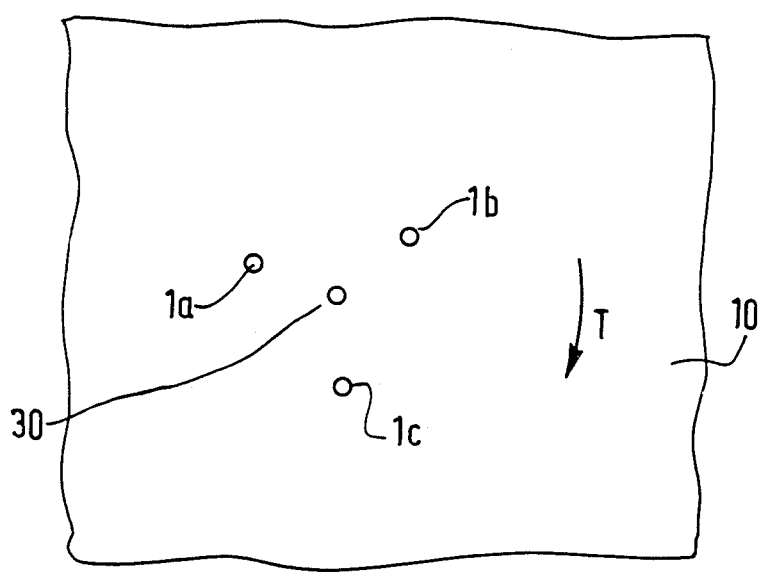
Figure 7A:
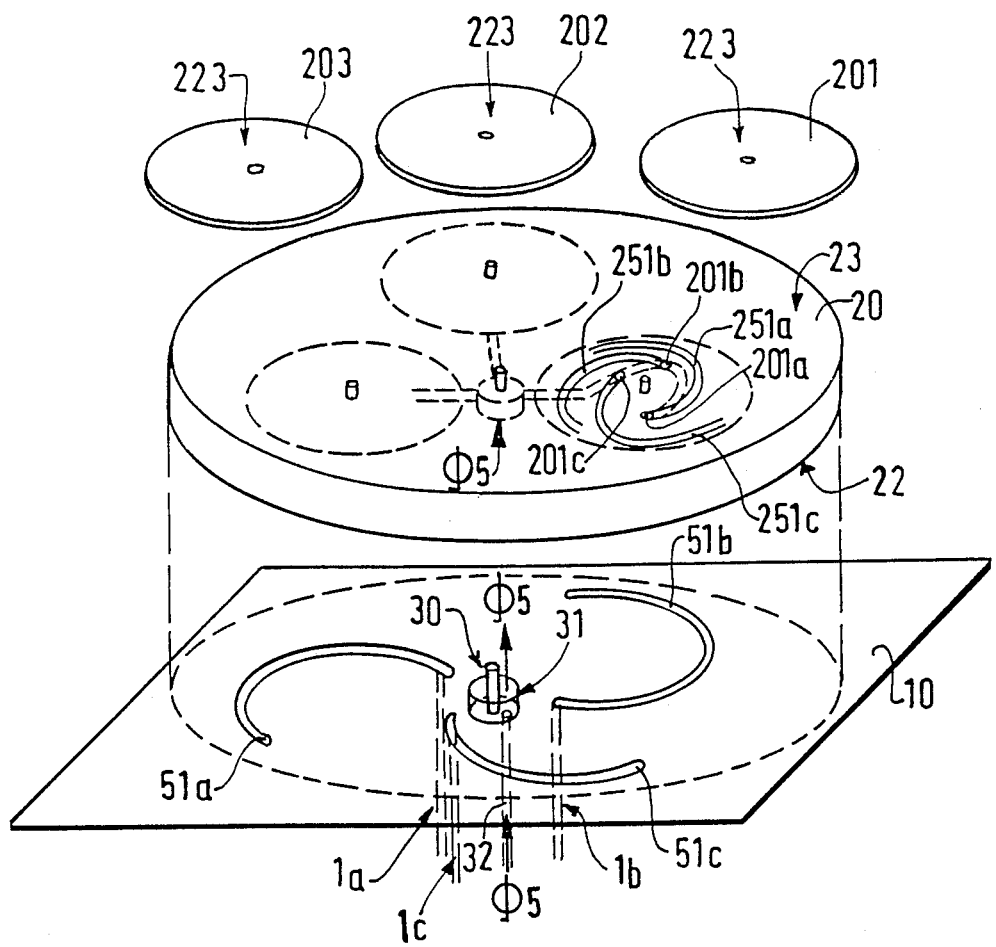
Figure 7B:
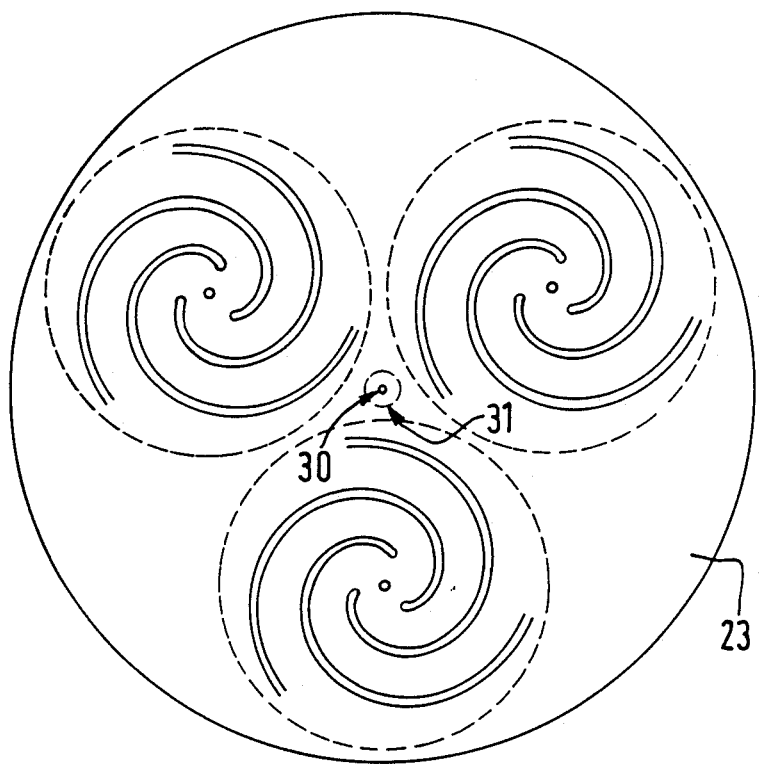
Figure 8:
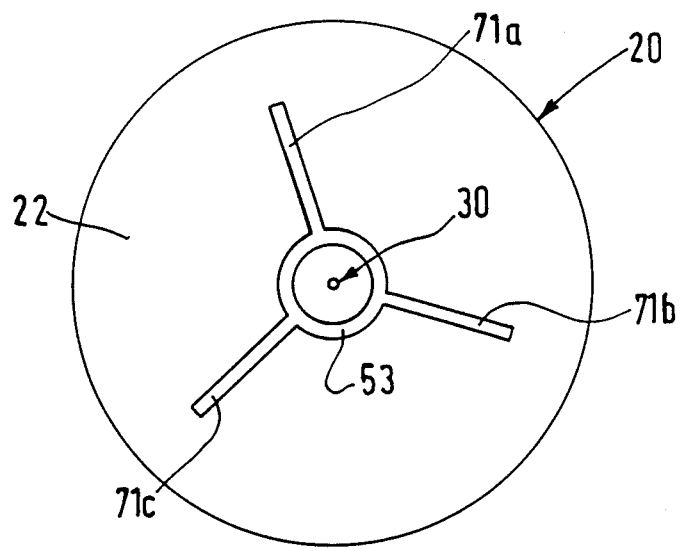
Figure 8:
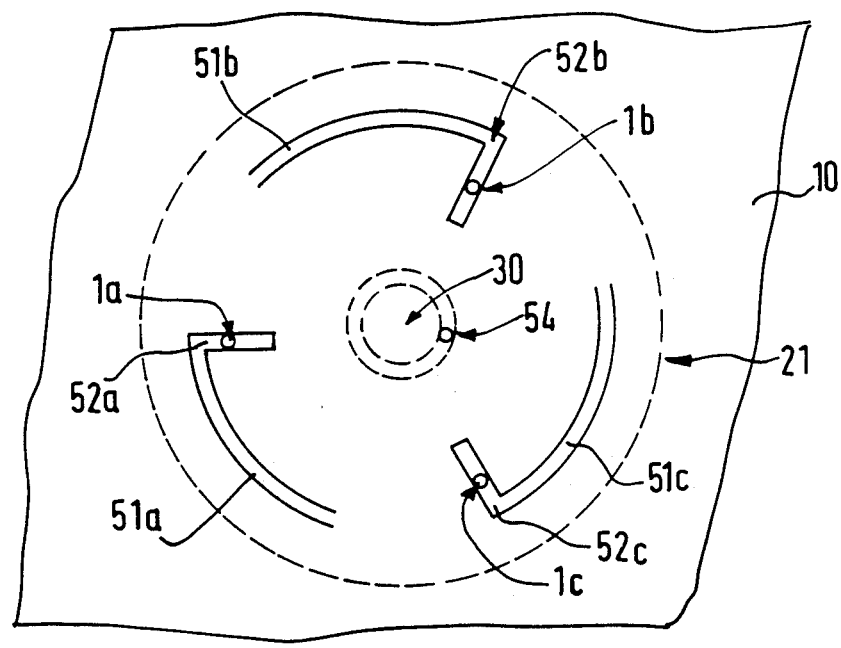

In order that the invention may be readily carried out, it will now be described more fully with reference to the accompanying drawings, in which:

FIG. 1a is a sectional view of a device according to the invention,

FIG. 1b is a sectional view of a second embodiment of a device according to the invention, FIG. 1c is a plan view of the reference surface of a third embodiment of a device according to the invention, FIG. 1d is a sectional view of the device shown in FIG. 1c, FIG. 2 shows the equivalent diagram of the resistances applied to the flows of gas in the different parts of the system formed by one of these devices, FIG. 3 shows the isobars corresponding to a flow of gas emerging from an opening in the reference surface, FIG. 4a shows an embodiment of a susceptor provided with a rotary shaft, FIG. 4b shows a second embodiment of a susceptor provided with a rotary shaft, FIG. 5a shows a susceptor provided with a rotary shaft having a form considered as preferable and provided with a system for setting into rotation according to an embodiment, in which a force of viscocity is applied, FIG. 5b shows a susceptor provided with a rotary shaft having a form considered as preferable and provided with a system for setting into rotation according to a second embodiment, in which a force of viscosity is applied, FIG. 5c shows the reference surface according to FIG. 5b in plan view, FIG. 6a shows a susceptor provided with a rotary shaft having a form considered as preferable and provided with a system for setting into rotation according to an embodiment, in which inertia forces are applied, FIG. 6b shows a susceptor provided with a rotary shaft having a form considered as preferable and provided with a system for setting into rotation according to a further embodiment, in which inertia forces are applied, FIG. 7a is an exploded and perspective view of a device permitting the planetary rotation of several susceptors in one of the embodiments according to the invention, FIG. 7b shows the upper surface of the base susceptor in the case of a planetary rotation in an embodiment, FIG. 8 shows a device permitting of facilitating the operation of stopping the rotation in a chosen position carried out on the susceptors set into planetary rotation.

As shown in FIG. 1a, the susceptor according to the invention is constituted by a rotating platform 20 about a shaft 30 parallel to a reference surface 10, the shaft 30 being perpendicular to this surface.

In the following description, a platform in the form of a disk will preferably be chosen.

According to the invention, this platform 20 is both held in sustentation above the surface 10 and set into rotation about the shaft 30 by the action of a flow of gas or several flows of gas.

FIG. 1a shows in sectional view that the platform 20 is held in sustentation at a distance h from the reference surface 10.

The sustentation is obtained in the embodiment shown in FIG. 1a by gas inlets 1a, 1b, ..., 1n such that the system is in the state of equilibrium, the inlet flow of gas being on the other hand perpendicular to the surface of the platform 20 and the surface 10.

In the state of sustentation, the gas injected through the inlets 1a, 1b, ..., 1n into the space between the platform 20 and the reference surface 10 will offer a resistance to the flows in the gap 4 having a height h leading to an increase in pressure on the surface 22 of the disk 20 with respect to the ambient pressure. The flow of gas will be made sufficiently large in order that the difference between this pressure and the ambient pressure integrated on the surface 22 is at least equal to the force of gravity on the disk 20.

In a stationary state of sustentation, this pressure difference is fixed by the weight of the disk 20 and cannot increase. In fact, for any slow increase of the flow, the platform 20 tends to be raised and the height h tends to be enlarged. The resistance of the gap 4 then decreases and the state of equilibrium of the surface is reestablished.

In the practical application, the platform 20 has to support a mass, for example a sample 100, which can be arranged eccentrically. In this case, the system is asymmetrical and it has to be ensured that the height h of the gap 4 remains at all points different from 0, that is to say that the distribution of the pressure on the lower surface 22 of the platform 20 also becomes correspondingly asymmetrical, in which event the sustentation can be designated as stable.

When the gas inlet 1 is unique and is arranged so that it coincides with the axis of symmetry of the non-loaded platform, i.e. in the case in which the platform is a disk, in coincidence with the rotary shaft 30, the system is entirely symmetrical and the height h of the gap is given by the relation:

$$h = [(3\eta/\pi \rho_D \delta)(1 - d_2^2/d^2) \cdot Deb]^{1/3} \quad (1)$$

in which $\eta$ is the viscocity of the gas, $\rho_D$ is the mass per unit surface area of the disk 20, $\delta$ is the acceleration of the gravity, $d_1$ is the diameter of the disk, $d_2$ is here the diameter of the gas inlet, Deb is the flow-rate of the gas. This system is shown in FIG. 1b.

In the case in which this system with unique supply is loaded in an asymmetrical manner, the range of stability depending upon the ratio of the diameter $d_1$ and $d_2$ and upon the flow-rate of gas, it appears that the range of stability is fairly reduced, which becomes manifest by the fact that the eccentricity of the mass 100 supported by the platform 20 cannot be large.

According to the invention, another arrangement of gas inlets is considered as preferable to enlarge the range of stability. This preferred arrangement comprises the gas inlet through $n > 2$ nonaligned openings $1a, 1b, \ldots, 1n$.

Preferably, these orifices $1a \ldots 1n$ are deduced from each other by a rotation of $2\pi/n$.

In the embodiments according to the invention described hereinafter, an arrangement of gas inlets comprising three openings 1a, 1b, 1c present at the tops of an equilateral triangle, whose center of symmetry coincides with the rotary shaft, has been chosen. This arrangement is shown in FIG. 1c, which shows in plan view the surface 10 of the reference wall. The edge of the sustained disk is represented at 21 by a broken line.

FIG. 1d shows the same system in sectional view taken on the axis II' passing through the centers of two of the openings 1b and 1c. This Figure shows that these openings 1b and 1c are connected to a supply lead 40 of gas through the tubes 41b and 41c. The opening 1a, which is not situated in the plane of FIG. 1d, is likewise connected to the lead 40 through the tube 41a. Moreover, the supply tubes 41a, 41b, 41c are provided with parts of reduced width $R_{1a}$, $R_{1b}$, $R_{1c}$ constituting resistances $R_i$. Each resistance $R_i$ has a value higher than or at least equivalent to the resistance R of the gap 4 in the part of this gap having a height h situated between the gas inlet, for example 1a, located in the reference plane 10 and the ambient inlet situated around the system constituted by the disk.

These resistances $R_i$ have the effect that they stabilize the value of the flow $\phi_1$ at the level at which the gas inlets 1a, 1b, 1c merge. FIG. 2 shows the equivalent diagram of the system provided with resistances $R_{1a}$, $R_{1b}$, $R_{1c}$. In this circuit diagram, $p_A$ represents the pressure of supply of one of the tubes, $R_i$ represents the resistance applied to this tube, R represents the resistance in the gap near the gas inlet and $p_S$ represents the pressure of sustentation.

For a gas inlet, for example that which is arranged very eccentrically with respect to the axis of symmetry (or of rotation 30), the isobars of pressure of sustentation shown in FIG. 3 show that, in the case in which the height h of the gap 4 is the same at all points, the pressure of sustentation is applied preponderantly near the opening 1a. The major part of the flow, whose local value is given by the distance between two isobars, passes into the region situated between the gas inlet orifice 1a and the edge 21 of the disk 20.

It is therefore clear that, if a variation of the height h occurs from one edge to the other of the disk 20, mainly the local height near the gas inlet orifice determines the resistance R.

If a mass is placed on the platform 20, in coincidence with the location of a gas inlet orifice, for example 1a, the value of h decreases at this location and the value of the resistance R increases. It follows therefrom (cf. FIG. 2) that the pressure of sustentation $p_S$ also increases and selectively contributes to the sustentation in the proximity of the orifice 1a.

By means of this mechanism, a high stability of sustentation is obtained by means of a flow of gas.

However, in order to avoid the lateral displacement of the sustained disk, it is necessary to localize it, but without preventing it from rotating about its axis of symmetry. For this purpose, several methods can be utilized.

FIGS. 4a and 4b each show a possible realization of this localization by a cut profile of the reference surface 10 and a complementary profile of the surface 22 of the disk 20. This kind of localization can be associated with several methods of setting the disk into rotation described below.

However, in order to obtain a device whose manufacture is less critical, it is considered as preferable, in order that the invention can be more advantageously applied to an epitaxy chamber, to choose a localization of the disk by a cylindrical rotary shaft 30.

The various methods of setting the disk into rotation according to the invention are shown by embodiments including the last-mentioned method of localization (cf. FIG. 5a and the following Figures).

The rotary movement can be obtained by means of a method chosen among the two methods described hereinafter or by means of a combination of these two methods.

The first method consists in producing a rotary movement by a force of viscosity. According to this method, a force $F_V$ is applied to a part of the surface 22 of the sustained disk. This force produces in the proximity of this surface 22 a flow of gas showing a velocity component in the direction of rotation illustrated by the arrow T, as shown in FIGS. 5, which show two devices according to this method. The part of the surface 22 of the disk on which this force is exerted being substantially smooth, the force is applied by an effect of viscosity of the gas. This force is expressed by the relation:

$$F_V = \eta \cdot \partial V/\partial z \quad (2)$$

in which: $F_V$ is the force per unit surface area, $\partial V/\partial Z$ is the derivative of its speed in the direction perpendicular to the surface 22.

This force can further be expressed by the proportionality relation $= F_V \alpha \eta. Deb$ (3) in which Deb is the flow rate.

In the case in which the system is used at a high temperature, the volume of the gas increases. On the other hand with regard to the viscosity $\eta$ itself, it increases for all gases when the temperature increases. Consequently, in order to obtain the same force of viscosity applied to the disk at a higher temperature, a lower mass flow rate is needed. The system is therefore perfectly adapted to the high temperatures.

An embodiment utilizing the force of viscosity of a gas to obtain the rotation of the disk 20 described above is shown in FIG. 5a in a perspective and an exploded view in order to illustrate the means for producing the rotary movement.

As shown in FIG. 5a, the susceptor according to the invention therefore comprises a disk 20 provided with a shaft 30. The surface 22 of the disk is essentially smooth, as already stated. The rotary movement is obtained in the direction of the arrow T due to the fact that a flow of gas $\phi_2$ is introduced into the groove 5 provided in the reference surface 10 through the inlet 2. This groove 5 has a rounded form and a radius smaller than that of the disk in order that the flow $\phi_2$ can act upon the latter by viscosity. The transverse dimension of the groove may be from 0.1 mm to several centimeters. The surface 10 moreover comprises, as already stated, at least three orifices 1a, 1b, 1c for the inlet of the flow of gas $\phi_1$ serving for sustentation.

In operation, the disk 20 is arranged with respect to the surface 10 in the manner shown in FIG. 1a.

One or several flows of gas may be used for setting the disk 20 into rotation. The supply of the inlets 1a, 1b, 1c can take place according to a method illustrated in FIG. 1d. The supply of the inlet 2 may also take place according to this method.

A second embodiment utilizing the force of viscosity of a gas to obtain the rotation of the disk 20 described above is shown in FIG. 5b in a perspective and exploded view in order to illustrate the means for producing the rotary movement.

As shown in FIG. 5b, the susceptor according to the invention therefore comprises a disk 20 provided with a shaft 30. The surface 22 of the disk 20 is here still essentially smooth. The rotary movement is obtained in the direction of the arrow T due to the fact that a flow of gas $\phi_3$ is introduced into the grooves 51a, 51b, 51c provided in the reference surface 10 through the inlets 1a, 1b and 1c, respectively. These grooves 51a, 51b, 51c have a rounded form and do not extend beyond the edge 21 of the edge of the disk in order that the flow $\phi_3$ can act upon the latter by viscosity. FIG. 5c shows an embodiment of these grooves in plan view.

The number of grooves 51 need not be limited to three, just like the number of inlets 1. The transverse dimension of the grooves may be from 0.1 mm to several centimeters and their depth may be from 10 $\mu$m to several millimeters.

In the embodiment illustrated in FIG. 5b, the function of setting into rotation and the function of stable sustentation are combined because each gas inlet orifice 1a, 1b, 1c for the sustentation corresponds to a groove 51a, 51b, 51c for the rotary movement.

It has been shown above, that temperature variations on the sample carrier of an epitaxy chamber could produce variations of the homogeneity of the epitaxial layers. It is known to those skilled in the art that moreover, if structures such as grooves are provided in the back surface of the sample carrier, the thermal image of these structures appears on the finished epitaxial layers in the form of homogeneity defects. Therefore, these structures have to be avoided as far as possible for such an application, or their presence has to be restricted to the edge of the disk in a zone not intended to receive a sample.

In the examples illustrated in FIGS. 5a and 5b, these grooves are therefore provided advantageously in the reference surface 10 rather than in the surface 22.

The second method of setting into rotation mentioned above consists in a transmission by inertia forces.

In fact it is possible to exert an angular movement on the sustained disk by causing the flow of gas to strike an arbitrary structure integral with the disk. Different structures apt to set the disk into motion when they receive a flow of gas are possible. A preferred structure for use in an epitaxy chamber is shown hereinafter.

By means of such a structure, the gas then transmits to the disk a part of its quantity of motion, this quantity of motion being proportional to $\rho.v^2$, $\rho$ being the mass of gas per unit of volume, which is written as:

$$F_i \alpha \rho. V^2 \quad (4)$$

or which can also be written as:

$$F_i \alpha \rho. Deb^2 \quad (5)$$

When comparing the relations (3) and (5), it can be ascertained that the force obtained by inertia increases as a function of temperature to a smaller extent than the force obtained by viscosity. However, both methods can be used very suitably at high temperatures.

An embodiment utilizing the inertia forces of a gas for obtaining the rotation of the disk 20 is described above is shown in FIGS. 6a and 6b.

FIG. 6a shows the arrangement of grooves 61, 62, 63, 64 provided in the surface 22 of the disk 20 and constituting the structures which will be struck by the flow of gas $\phi_4$.

For use in an epitaxy chamber, these structures will preferably be formed at the periphery of the disk 20, as already stated above.

These grooves 61, 62, 63, 64 in this embodiment are roughly shaped into the form of a U and merge at the edge 21 of the platform 20. These grooves are here $n'=4$ in number and are deduced from each other by a rotation of $2\pi/4$.

These grooves 61, 62, 63, 64 are supplied through a circular groove 7, which may be provided either in the reference surface 10, as shown in FIG. 6a, or in the surface 22 of the disk, as shown in FIG. 6b, where it directly merges at the grooves 61, 62, 63, 64.

Thus, according to the invention, one or several flows of gas are sufficient to sustain a disk and to set it into rotation.

As to the behaviour at pressures different from the ambient pressure for the two methods of transmission in accordance with the invention, the relations given above for the forces permit an evaluation thereof.

For the transmission by viscosity, in fact there can be written that:

$$F_{\nu}\alpha\eta.Deb = \eta.Deb_0.p/p_0 \quad (3)$$

$p_0$ is the ambient pressure,
p is the working pressure.

The viscosity $\eta$ is not in the first order a function of the pressure for all the gases provided that this pressure is sufficiently high so that the free path of the molecules does not exceed the characteristic dimensions of the traversed structure, i.e. the thickness of the gap 4, which is h (typically 50 μm to 100 μm). This method of transmission and sustentation can be applied to any gas at any pressure beyond this limit value, i.e. in practice above 0.1 millibar.

In order to obtain the same transmission force by viscosity at a pressure reduced by a factor K, the mass flow rate can consequently be reduced by the same factor K.

An analogous analysis starting from the relation:

$$F_i \alpha p.Deb^2 \quad (5)$$

for the transmission by inertia forces shows that in this case the reduction of the mass flow rate is $\sqrt{K}$.

For very low pressures, the transmission by viscosity is therefore more economical for the flow rate of gas.

This invention can be used advantageously for the manufacture of sample carriers for a vapour-phase epitaxy chamber.

It can be seen that the behaviour of the different systems proposed at an increasing temperature is excellent. It can also be seen that the arrangement of the structures of sustentation or setting into rotation is very favourable for obtaining homogeneous layers.

Supplementary conditions for obtaining homogeneous layers are on the one hand a good thermal contact between the sample susceptor and the reference surface forming the source of heat and on the other hand a uniform rotation of the samples, as is described in the publication considered as the prior art.

In the particular application for the manufacture of epitaxial layers of materials of the III–V group, the sample carrier is brought to a temperature of the order of 600° C. to 850° C. in the proximity of the reference surface 10 constituted by the lower wall of the epitaxy chamber, which transmits the heat of a source. The deposition from the gaseous phase takes place by means of a material in the gaseous form mixed, for example, with hydrogen, which then constitutes a vector gas.

It is then particularly advantageous to use the invention for the manufacture of the sample carrier of the epitaxy chamber by choosing the same vector gas for forming the flow of gas producing the sustentation and the setting into rotation.

The method of sustentation and setting into rotation is then very simple.

In order to further improve the homogeneity of the layers, it can be ensured that the upper surface of the disk 20 is provided with several sample-supporting disks each rotating with respect to the disk 20 by means of one of the methods described above and thus producing a so-called "planetary" rotation for the samples.

FIG. 7a shows an embodiment, in which a number of $n''=3$ disks rotate according to a principle already described and illustrated in FIG. 5b.

In this embodiment, the disk 20 is sustained and set into rotation by a flow of gas arriving through the non-aligned openings 1a, 1b, 1c and propagating in the rounded grooves 51a, 51b, 51c. About the rotary shaft 30 of the platform 20 is arranged the inlet of a flow $\phi_5$ propagating as far as into the thickness of the platform 20, through which thickness are provided conduits for taking the flow $\phi_5$ to at least three orifices under each of the secondary disks 201, 202, 203.

The disk 201 is thus associated with the orifices 201a, 201b, 201c. The disks 202 and 203 are themselves each associated with three orifices not shown in FIG. 7a for the sake of simplicity of the drawing.

To each of the orifices corresponds a curved groove, such as, for example, shown in FIG. 7b, which is a representation of the surface 22 of the disk 20. For the orifices 201a, 201b and 201c, the corresponding grooves are designated by 251a, 251b and 251c.

In this system shown in FIG. 7a, the samples are placed on the surfaces 223 of the disks 201, 202, 203. The principle of setting into rotation is that illustrated in FIG. 5b and described above.

It is clear that each of the principles illustrated in FIGS. 5a and 6a, 6b could have been used or combined.

The different susceptors according to the invention may be formed from any kind of hard materials of low deformation, inclusive of polymers.

With the use in an epitaxy chamber, these materials must moreover be refractory. These materials may be: graphite, metals, ceramic materials, crystalline materials, such as silicon, gallium arsenide, sapphire.

All these materials may be used for the disk, for the shaft as well as for the support.

The suitable gases may be chosen among hydrogen, nitrogen and any neutral gas. However, other gases may be chosen for particular applications not mentioned here.

A device according to the invention is particularly advantageous to cause the rotation to be stopped in a given position. This is particularly useful for loading and unloading of the samples in the case of a planetary rotation.

This device is shown in FIG. 8. This Figure represents the orifices and the grooves provided in the reference surface 10 on the one hand and the grooves provided in the surface 22 of the susceptor disk on the other hand.

The reference surface 10 comprises the rotary shaft 30 and three grooves 51a, 51b and 51c formed in the proximity of the trail 21 of the edge of the disk. This surface moreover comprises three radial grooves 52a, 52b and 52c, respectively, merging into these three grooves. The grooves 52a, 52b and 52c are supplied through the three orifices 1a, 1b and 1c, respectively, as already described above.

The surface 22 of the disk 20 comprises a circular groove 53 concentrical to the rotary shaft and situated in the proximity of the latter, which is designated as "central groove". The surface 22 moreover comprises three radial grooves 71a, 71b, 71c. In a modification, the central groove 53 may be provided in the reference surface 10.

In the surface 10 is formed an orifice 54 connected to a tube closed by a valve. This orifice 54, designated as "central orifice", is provided opposite to the central groove 53 or so as to merge into this groove.

When the flow(s) of gas arriving through the orifices 1a, 1b, 1c is (are) cut off and when the valve closing the central orifice 54 is opened, the disk 20 is fixed in the position in which one of the grooves 71a, 71b, 71c coincides with one of the grooves 52a, 52b, 52c. This structure therefore permits three angular stop positions of the disk 20, these positions being spaced apart by 120°.

In the case of the planetary rotation, it is advantageous to use this structure for the platform 20 and for the surface 10.

What is claimed is:

1. A device comprising
   a reference surface having a plurality of non-aligned orifices, said plurality being greater than 2,
   a flat susceptor disk rotating parallel to said reference surface, said disk being supported from said reference surface by at least one flow of gas from said orifices, said orifices in said reference surface being within the periphery of said disk, and
   a rotary shaft perpendicular to said reference surface, said rotary shaft being cylindrical with a small diameter relative to a diameter of said disk, and said rotary shaft being disposed between said reference surface and said disk at the center of symmetry of said disk,
   wherein said disk is maintained at a separation distance h greater than zero from said reference surface by said flow of gas, and
   wherein said orifices are separated from one another by a rotation of $2\pi/n$, where n is the number of orifices,
   wherein rotary movement of said disk is obtained by a force of viscosity of a supplementary flow of gas, and wherein said reference surface includes at least one additional orifice and a groove having a curved portion extending from said additional orifice for passing said supplementary flow of gas into said groove to effect rotary movement of said disk, said curved groove portion being disposed within said periphery of said disk, and a second portion extending from said curved portion outwardly beyond said periphery of said disk.

2. A device according to claim 1, wherein said disk includes a number of secondary susceptor disks on a surface facing away from said reference surface, said secondary disks being of a diameter smaller than said flat susceptor disk, and said secondary disks being separated from one another by a rotational distance of $2\pi/n'$, where n' equals the number of secondary disks, and wherein said surface of said flat susceptor disk includes a groove structure relative to each secondary disk for rotation of said secondary disks, said groove structure receiving gas from another orifice in said reference surface.

3. A device according to claim 2, wherein said number n' of secondary disks equals 3.

4. A device according to claim 3, wherein said number of orifices n equals 3.

5. A device comprising
   a reference surface having a plurality of non-aligned orifices, said plurality being greater than 2,
   a flat susceptor disk rotating parallel to said reference surface, said disk being supported from said reference surface by at least one flow of gas from said orifices, said orifices in said reference surface being within the periphery of said disk, and
   a rotary shaft perpendicular to said reference surface, said rotary shaft being cylindrical with a small diameter relative to a diameter of said disk, and said rotary shaft being disposed between said reference surface and said disk at the center of symmetry of said disk,
   wherein said disk is maintained at a separation distance h greater than zero from said reference surface by said flow of gas, and
   wherein said orifices are separated from one another by a rotation of $2\pi/n$, where n is the number of orifices,
   wherein rotary movement of said disk is obtained by a force of viscosity of said gas, wherein said reference surface includes a number of grooves equal to said number n of orifices, said number of grooves connected to said orifices for applying said flow of gas into said groove to effect rotary movement of said disk, and wherein said number of grooves each have a helical form, said helical form of each groove being disposed within said periphery of said disk.

6. A device according to claim 5, wherein said disk includes a number of secondary susceptor disks on a surface facing away from said reference surface, said secondary disks being of a diameter smaller than said flat susceptor disk, and said secondary disks being separated from one another by a rotational distance of $2\pi/n'$, where n' equals the number of secondary disks, and wherein said surface of said flat susceptor disk includes a groove structure relative to each secondary disk for rotation of said secondary disks, said groove structure receiving gas from another orifice in said reference surface.

7. A device according to claim 6, wherein said number n' of secondary disks equals 3.

8. A device according to claim 7, wherein said number of orifices equals 4.

9. A device comprising
   a reference surface having a plurality of non-aligned orifices, said plurality being greater than 2, a flat susceptor disk rotating parallel to said reference surface, said disk being supported from said reference surface by at least one flow of gas from said orifices, said orifices in said reference surface being within the periphery of said disk, and a rotary shaft perpendicular to said reference surface, said rotary shaft being cylindrical with a small diameter relative to a diameter of said disk, and said rotary shaft being disposed between said reference surface and said disk at the center of symmetry of said disk, wherein said disk is maintained at a separation distance h greater than zero from said reference surface by said flow of gas, and wherein said orifices are separated from one another by a rotation of $2\pi/n$, where n is the number of orifices, wherein rotary movement of said disk is obtained by a force of viscosity of a supplementary flow of gas, wherein said reference surface includes the following structure (a) a first number of radially extending grooves in a region bounded by said periphery of said disk, said grooves having a length smaller than the radius of said disk, and said grooves being connected to said number n of orifices, (b) a second number of grooves disposed parallel to the edge of said disk, said second number of said grooves merging into said first number of radially extending-grooves, where rotary movement is effected by the passing of the gas from said orifices into said second number of grooves, (c) a groove concentric to said rotary shaft and in proximity to said rotary shaft, said groove being designated as the central groove, and (d) an orifice connected to said central groove and designated as the central orifice, said central orifice being connected to an outlet, said outlet being closable by a valve, wherein said susceptor disk includes the following structure (a) a number of radial grooves of said disk disposed on a surface of said disk opposite to said reference surface, said number of radial grooves having a length smaller than the radius of said second number of grooves of said reference surface, and (b) a central groove of said disk concentric to said rotary shaft at said disk surface, said central groove of said disk connected to said number of radial grooves of said disk, and wherein said disk is stopped from rotation upon said number of radial grooves of said disk being aligned with said first number of radially extending grooves of said reference surface by the stopping flow of gases to said n orifices of said reference surface and simultaneously opening said valve of said central orifice of said reference surface.

10. A device according to claim 9, wherein said disk includes a number of secondary susceptor disks on a surface facing away from said reference surface, said secondary disks being of a diameter smaller than said flat susceptor disk, and said secondary disks being separated from one another by a rotational distance of $2\pi/n'$, where n' equals the number of secondary disks, and wherein said surface of said flat susceptor disk includes a groove structure relative to each secondary disk for rotation of said secondary disks, said groove structure receiving gas from another orifice in said reference surface.

11. A device according to claim 10, wherein said number n' of secondary disks equals 3.

12. A device according to claim 11, wherein said number of orifices equals 4.

13. A device comprising a reference surface having a plurality of non-aligned orifices, said plurality being greater than 2, a flat susceptor disk rotating parallel to said reference surface, said disk being supported from said reference surface by at least one flow of gas from said orifices, said orifices in said reference surface being within the periphery of said disk, and a rotary shaft perpendicular to said reference surface, said rotary shaft being cylindrical with a small diameter relative to a diameter of said disk, and said rotary shaft being disposed between said reference surface and said disk at the center of symmetry of said disk, wherein said disk is maintained at a separation distance h greater than zero from said reference surface by said flow of gas, and wherein said orifices are separated from one another by a rotation of $2\pi/n$, where n is the number of orifices, wherein rotary movement of said disk is obtained by an inertial force of a supplementary flow of gas, and wherein said reference surface includes a circular groove having a diameter smaller than the diameter of said disk, said circular groove being concentric to said disk, and wherein said disk includes a plurality of grooves in the shape of a U extending from said periphery of said disk to a position above said circular groove on said reference surface, said plurality of grooves on said disk being rotationally separated by a distance of $2\pi/n'$ where n' equals the number of said grooves and where rotary movement is effected by the flow of gas from said orifices to strike said plurality of grooves in said disk.

14. A device comprising a reference surface having a plurality of non-aligned orifices, said plurality being greater than 2, a flat susceptor disk rotating parallel to said reference surface, said disk being supported from said reference surface by at least one flow of gas from said orifices, said orifices in said reference surface being within the periphery of said disk, and a rotary shaft perpendicular to said reference surface, said rotary shaft being cylindrical with a small diameter relative to a diameter of said disk, and said rotary shaft being disposed between said reference surface and said disk at the center of symmetry of said disk, wherein said disk is maintained at a separation distance h greater than zero from said reference surface by said flow of gas, and wherein said orifices are separated from one another by a rotation of $2\pi/n$, where n is the number of orifices, wherein rotary movement of said disk is obtained by an inertial force of a supplementary flow of gas, wherein said disk includes a circular groove on a surface facing said reference surface, said circular groove having a diameter smaller than the diameter of said disk, said diameter of said circular groove being concentric to said disk, and wherein said disk includes a plurality of grooves in the shape of a U extending from said periphery of said disk to said circular groove, said plurality of grooves being rotationally separated by a distance $2\pi/n'$ where $n'$ equals the number of said grooves and where rotary movement is effected by the flow of gas from said orifices to strike said plurality of grooves in said disk.

15. A device according to claim 13 or claim 14, wherein $n'$ equals 4.

16. A device according to claim 13 or 14, wherein said disk includes a number of secondary susceptor disks on a surface facing away from said reference surface, said secondary disks being of a diameter smaller than said flat susceptor disk, and said secondary disks being separated from one another by a rotational distance of $2\pi/n''$, where $n''$ equals the number of secondary disks, and wherein said surface of said flat susceptor disk includes a groove structure relative to each secondary disk for rotation of said secondary disks, said groove structure receiving gas from another orifice in said reference surface.

17. A device according to claim 16, wherein said number $n''$ of secondary disks equals 3.

18. A device according to claim 17, wherein said number of orifices n equals 3.

* * * * *